US008673180B2

(12) United States Patent
Vogt

(10) Patent No.: US 8,673,180 B2
(45) Date of Patent: Mar. 18, 2014

(54) UP-CONVERSION WHITE LIGHT PHOSPHORS

(75) Inventor: Thomas Vogt, Chapin, SC (US)

(73) Assignee: University of South Carolina, Columbia, SC (US)

(*) Notice: Subject to any disclaimer, the term of this patent is extended or adjusted under 35 U.S.C. 154(b) by 202 days.

(21) Appl. No.: 13/178,900

(22) Filed: Jul. 8, 2011

(65) Prior Publication Data

US 2011/0309303 A1 Dec. 22, 2011

Related U.S. Application Data

(63) Continuation-in-part of application No. 12/476,652, filed on Jun. 2, 2009, now Pat. No. 8,168,086.

(60) Provisional application No. 61/362,837, filed on Jul. 9, 2010, provisional application No. 61/130,736, filed on Jun. 3, 2008.

(51) Int. Cl.
*C09K 11/68* (2006.01)

(52) U.S. Cl.
USPC .................. 252/301.4 F; 252/301.5; 313/486

(58) Field of Classification Search
USPC ....................... 252/301.4 H, 301.45; 313/486
See application file for complete search history.

(56) References Cited

U.S. PATENT DOCUMENTS

| | | | | |
|---|---|---|---|---|
| 6,924,233 | B1 | 8/2005 | Chua et al. | |
| 6,982,045 | B2 | 1/2006 | Menkara et al. | |
| 6,987,353 | B2 | 1/2006 | Menkara et al. | |
| 7,109,648 | B2 | 9/2006 | Menkara et al. | |
| 7,112,921 | B2 | 9/2006 | Menkara et al. | |
| 8,168,085 | B2 * | 5/2012 | Vogt et al. | 252/301.4 H |
| 8,168,086 | B2 * | 5/2012 | Vogt et al. | 252/301.4 H |
| 2009/0127508 | A1 | 5/2009 | Kubel | |
| 2009/0174310 | A1 | 7/2009 | Vogt | |
| 2009/0212314 | A1 | 8/2009 | Im et al. | |

OTHER PUBLICATIONS

Prodjosantoso, et al., "Cation and anion ordering in the layered oxyfluorides $Sr_{3-x}A_xAlO_4F$ (A=Ba, Ca)", *Journal of Solid State Chemistry*, 172, pp. 89-94 (2003).

Vogt, et al., "Brief Communication, $Sr_3MO_4F$ (*M*=Al, Ga)—A New Family of Ordered Oxyfluorides", *Journal of Solid State Chemistry*, 144, pp. 228-231 (1999).

* cited by examiner

*Primary Examiner* — Carol M Koslow
(74) *Attorney, Agent, or Firm* — Dority & Manning, P.A.

(57) ABSTRACT

Light emitting devices that include an energy source configured to generate light energy and an up-conversion phosphor configured to emit light having a wavelength shorter than that of the light energy generated from the energy source are provided. The up-conversion phosphor comprises an ordered oxyfluoride compound having a formula: $A_{3-3a/2}R_a MO_{4-\delta1-w}F_{1-\delta2-w''}N_w$. Methods are also generally disclosed for up-converting light energy.

30 Claims, 2 Drawing Sheets

UP-CONVERSION WHITE LIGHT PHOSPHORS

PRIORITY INFORMATION

The present application claims priority to U.S. Provisional Patent Application Ser. No. 61/362,837 titled "Up-Conversion White Light Phosphors" filed on Jul. 9, 2010 of Thomas Vogt, the disclosure of which is incorporated by reference herein. The present application also claims priority to and is a continuation-in-part of U.S. patent application Ser. No. 12/476,652 titled "Inorganic Luminescent Phosphor Materials for Lighting" of Vogt, et al. filed on Jun. 2, 2009 and issued as U.S. Pat. No. 8,168,086, which claims priority to U.S. Provisional Patent Application Ser. No. 61/130,736 filed on Jun. 3, 2008, the disclosures of which are incorporated by reference herein.

BACKGROUND OF INVENTION

Up-conversion or anti-Stokes processes occur in materials capable of absorbing photons at energies lower than the subsequently emitted photons. These materials can convert near-IR radiation to light in the visible part of the electromagnetic spectrum. In up-conversion processes either single- or multi-photon excitations take place. A well-known type of an up-conversion process is the excitation of anti-Stokes emission bands in Raman spectroscopy, where a lower energy photon is converted to a higher energy one and the additional energy required is provided by lattice when one or more phonons are annihilated. Anti-Stokes bands occur at specific energies determined by the phonon spectrum of the host lattice. A vibronic ground state absorbs an excitation photon and the emission occurs from a so-called virtual excited state into the ground state. Typically the emission occurs at energies which are 100-1000 $cm^{-1}$ higher than the energy of the excitation photon. This can be used to infer the phonon spectrum of the material since the energies of phonons are quite often well-defined. This is a very inefficient process: in Si the anti-Stokes Raman emission has an efficiency of $10^{-13}$ $cm^2W^{-1}$.

In a two-photon up-conversion process a virtual intermediate state exists, while both ground and excited states are real. Spontaneous emissions of photons during the decay of excited atoms are prohibited by ordinary quantum mechanics and require the quantization of the electromagnetic field. The two-photon up-conversion process requires that the sum of energies of the two exciting photons be larger than the band gap energy and the simultaneous absorption of two photons is an inherently less efficient process than single photon absorption. The efficiency of two-photon absorption of the red-light from a pulsed ruby laser in $CaF_2$:$Eu^{2+}$ resulting in blue photons is ~$10^{-12}$ $cm^2W^{-1}$. Another two photon process is second harmonic generation: exciting $KH_2PO_4$ or $KNbO_3$ with 1064 nm laser light from a $Nd^{3+}$ YAG an emission in the green at 532 nm is observed. In this case the two photons need to be coherent and both the intermediate and the excited state are virtual states with a zero life time.

Another process relies on the sequential absorption of two photons by two different activator ions and their subsequent decay into their ground states from a virtual excited state while emitting photons with energies equal to the sum of the energies of the individual ions. This cooperative luminescence has been observed in $Yb^{3+}$: $YbPO_4$ where it occurs with an efficiency of ~$10^{-8}$ $cm^2W^{-1}$ when two exited $Yb^{3+}$ activators generate a single photon emission in the green part of the spectrum. In a similar process two excited photons are sequentially absorbed and raised into their excited states where they are then transferred to another activator bringing this ion to an excited state with energies equal to the sum of the two excited activators. The final state is a real and therefore this cooperative sensitization is more efficient than cooperative luminescence. In $Yb^{3+}$, $Tb^{3+}$: $YF_3$ the sensitization of $Tb^{3+}$ from $Yb^{3+}$ activators has an efficiency of $10^{-6}$ $cm^2W^{-1}$.

Three photon up conversion processes are also known: in $SrF_2$: $Er^{3+}$ up to three 1 μm photons can be absorbed sequentially by $Er^{3+}$ allowing emission in the blue, green or red regions of the electromagnetic spectrum. In the process a real intermediate state is needed since only at a finite life time of this state can the initial excitation be further promoted by a second excited photon.

Other systems where three-photon absorption and up-conversion processes have been established are $Er^{3+}$:$YF_3$ and $Tm^{3+}$, $Yb^{3+}$:$NaYF_4$. In the latter system 4-photon processes are also possible.

Frequency up-conversion luminescence has great potential applications in diode-pumped all-solid-state visible laser, highly efficient next generation lighting, near-IR photon detectors, high power fiber up-conversion lasers, nm-sized biological labels and new emissive displays. Up-to-date rare earths have mainly been doped into oxyfluoride glasses since oxyfluorides combine the favorable low phonon energy and high up-conversion efficiencies with the high mechanical and chemical stabilities of oxides.

A need exists for improved materials, devices, and methods that utilize up-conversion to absorb photons at energies lower than their subsequently emitted photons.

SUMMARY

Objects and advantages of the invention will be set forth in part in the following description, or may be obvious from the description, or may be learned through practice of the invention.

In general, the present disclosure is directed toward light emitting devices that include an energy source configured to generate light energy and an up-conversion phosphor configured to emit light having a wavelength shorter than that of the light energy generated from the energy source. The up-conversion phosphor comprises an ordered oxyfluoride compound having a formula:

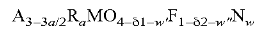

$$A_{3-3a/2}R_aMO_{4-\delta1-w'}F_{1-\delta2-w''}N_w$$

where A is Sr alone or Sr mixed with Ba and/or Ca such that A is made up of at least ⅔ mole % of Sr and ⅓ mole % or less of Ba and/or Ca; R is La, Ce, Pr, Nd, Pm, Sm, Eu, Gd, Tb, Dy, Ho, Er, Tm, Yb, Lu, Ac, Th, U, Cr, Mn, Tc, Re, Cu, Ag, Au, Zn, Cd , Hg, As, Sb, Bi, Ge, Sn, Pb, In, TI, Ni, Os, Mo, or combinations thereof; M is Al, Ga, In, B, W, Mo, or mixtures thereof; $0<a<0.3$; δ1 and δ2 are both about 0.01 to about 0.15; and $0\leq w\leq 0.05$ such that $0\leq w'\leq 0.1$ and $0\leq w''\leq 0.15$.

Methods are also generally disclosed for up-converting light energy. The method can include exposing an up-conversion phosphor to light energy such that the up-conversion phosphor emits light having a wavelength shorter than that of the light energy. The up-conversion phosphor comprises an ordered oxyfluoride compound having a formula:

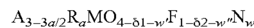

$$A_{3-3a/2}R_aMO_{4-\delta1-w'}F_{1-\delta2-w''}N_w$$

where A is Sr alone or Sr mixed with Ba and/or Ca such that A is made up of at least ⅔ mole % of Sr and ⅓ mole % or less of Ba and/or Ca; R is La, Ce, Pr, Nd, Pm, Sm, Eu, Gd, Tb, Dy, Ho, Er, Tm, Yb, Lu, Ac, Th, U, Cr, Mn, Tc, Re, Cu, Ag, Au, Zn, Cd , Hg, As, Sb, Bi, Ge, Sn, Pb, In, TI, Ni, Os, Mo, or combinations thereof; M is Al, Ga, In, B, W, Mo, or mixtures thereof; $0<a<0.3$; δ1 and δ2 are both about 0.01 to about 0.15; and $0 \le w \le 0.05$ such that $0 \le w' \le 0.1$ and $0<w''<0.15$.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures, in which.

DETAILED DESCRIPTION

Figure 1:
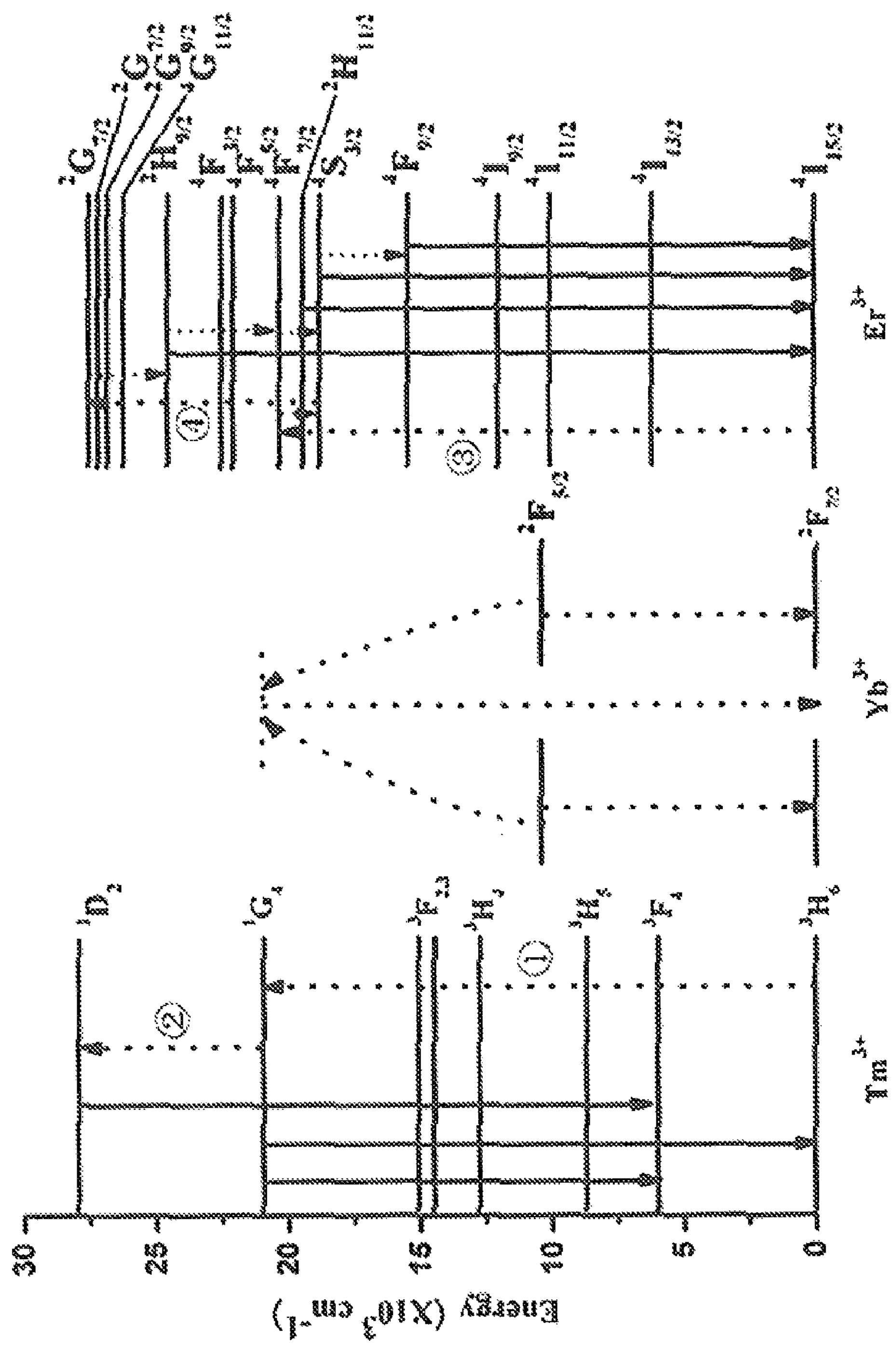
FIG. 1 shows the energy level diagrams of $Tm^{3+}$, $Yb^{3+}$ and $Er^{3+}$.

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth. Additionally, it is to be understood that the chemical abbreviation includes all isotopes and ions, unless otherwise stated.

In general, the present disclosure is directed to phosphors utilizing up-conversion characteristics for in light emitting devices. The light emitting device can include an energy source configured to apply light energy to the phosphor. The phosphor can then up-convert the light energy to a higher energy (i.e., lower wavelength). For example, the light energy that excites the up-conversion phosphor can have a wavelength of from about 750 nm to about 1100 nm (e.g., about 800 nm to about 1000 nm). The up-conversion phosphor can then emit light having a lower (i.e., shorter) wavelength, such as in the visible spectrum (i.e., about 380 nm to about 750 nm).

Particularly suitable compound for up-conversion emission include rare earth ions doped in host lattices according to Formula 1:

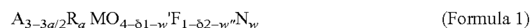

$$A_{3-3a/2}R_a MO_{4-\delta1-w'}F_{1-\delta2-w''}N_w \quad \text{(Formula 1)}$$

where

A is Sr alone or Sr mixed with Ba and/or Ca such that A is made up of at least ⅔ mole % of Sr and ⅓ mole % or less of Ba and/or Ca;

R is a rare earth element from the atomic numbers 57-71 (i.e., the lanthanoid series including the fifteen elements with atomic numbers 57 through 71: La, Ce, Pr, Nd, Pm, Sm, Eu, Gd, Tb, Dy, Ho, Er, Tm, Yb, and Lu), an activator (e.g., Ac, Th, U, Cr, Mn, Tc, Re, Cu, Ag, Au, Zn, Cd, Hg, As, Sb, Bi, Ge, Sn, Pb, In, TI), and/or any combinations or mixtures thereof;

M is Al, Ga, In, B, W, Mo and/or mixtures thereof;

$0<a<0.3$;

δ1 and δ2 are both about 0.01 to about 0.15; and $0 \le w \le 0.05$ such that $0 \le w' \le 0.1$ and $0 \le w'' \le 0.15$.

When nitrogen is absent (i.e., w=0), then the compound can be more simply represented by Formula 2:

$$A_{3-3a/2}R_a MO_{4-\delta1}F_{1-\delta2} \quad \text{(Formula 2)}$$

where where A is Sr alone or Sr mixed with Ba and/or Ca such that A is made up of at least ⅔ mole % of Sr and ⅓ mole % or less of Ba and/or Ca;

R is a rare earth element from the atomic numbers 57-71 (i.e., the lanthanoid series including the fifteen elements with atomic numbers 57 through 71: La, Ce, Pr, Nd, Pm, Sm, Eu, Gd, Tb, Dy, Ho, Er, Tm, Yb, and Lu), an activator (e.g., Ac, Th, U, Cr, Mn, Tc, Re, Cu, Ag, Au, Zn, Cd, Hg, As, Sb, Bi, Ge, Sn, Pb, In, TI), and/or any combinations or mixtures thereof;

M is Al, Ga, In, B, W, Mo and/or mixtures thereof;

$0<a<0.3$; and

δ1 and δ2 are both about 0.01 to about 0.15.

Nitrogen can be incorporated into the compound of Formula 2 by streaming ammonia over an ordered oxyfluoride compound without any nitrogen present, followed by a subsequent reaction using hydrogen and/or various hydrogen/argon mixtures (creating an oxyfluoridenitride). The difference in charge between nitride (−3) and oxide (−2) and fluoride (−1) drives the relationship between w, w' and w'' of the molecule shown in Formula 1. For example, two nitride anions and a defect hole are substituted for three oxide anions to balance the covalence charge of the resulting compound. Likewise, a nitride anion and two defect holes are substituted for three fluoride anions to balance the covalence charge of the resulting compound.

The compounds of Formula 1 and Formula 2 can be formed by creating defects in the oxygen and fluorine containing sub-lattice of an ordered oxyfluoride compound crystallized in a layered structure in which the layers made of isolated $MO_4$ tetrahedra separated by $A_2F^{3+}$ layers. The defects in the oxygen and fluorine sub-lattice of the ordered oxyfluoride compounds can be introduced to form the presently disclosed self-activating phosphors according to any method, such as disclosed in U.S. patent application Ser. No. 12/476,652 of Vogt, et al. filed on Jun. 2, 2009 and issued as U.S. Pat. No. 8,168,068, the disclosure of which is incorporated by reference herein.

In one embodiment, the ordered oxyfluoride compound in a powder form can be exposed to a reducing gas (e.g., hydrogen, argon or hydrogen/argon mixture gas). The gas can be air or a mixture of particular gases (e.g., Ar, $H_2$, or a mixture thereof, such as Ar:$H_2$::5-10%:85-90% by volume) that can remove oxygen and fluorine atoms from the ordered oxyfluoride compound. Without wishing to be bound by theory, it is believed that the hydrogen gas reduces the self-activating phosphor to remove oxygen and fluorine atoms. Thus, the by-product gas may include water and HF gases.

Reducing the ordered oxyfluoride material can be performed at elevated temperatures to control the amount of defects created, to facilitate the reduction reactions, and to ensure that any by-product gas formed by the reaction is removed from the resulting self-activating phosphors. The temperature of this reaction with the hydrogen, argon argon/ hydrogen mixture gas can be utilized to control the amount of defects present in the oxygen and fluorine sub-lattice.

Generally, the temperature of the gas will be from about 200° C. to about 1000° C., such as from about 500° C. to about 1000° C. and from about 800° C. to about 1000° C.

The time the compound is exposed to the hydrogen, argon and argon/hydrogen mixture gas can be utilized to control the amount of defects present in the oxygen and fluorine sub-lattice. Generally, using a hotter hydrogen gas requires less exposure time to achieve similar defect levels, and conversely, using a lower temperature of gas requires more exposure time to achieve similar defect levels. The flow of gas can also be regulated to control the amount of defects introduced into the ordered oxyfluoride material.

The defects occur in both the oxygen and fluorine sub-lattices of the crystalline structure and introduce two additional variables ( δ1 and δ2 ) into the formula. The amount of defects in the oxygen and fluorine sub-lattice can be controlled as desired. In one particular embodiment, the defects in the oxygen and fluorine sub-lattice can be such both δ1 and δ2 are about 0.01 and about 0.15, such as about 0.05 to about 0.1.

Figure 2:
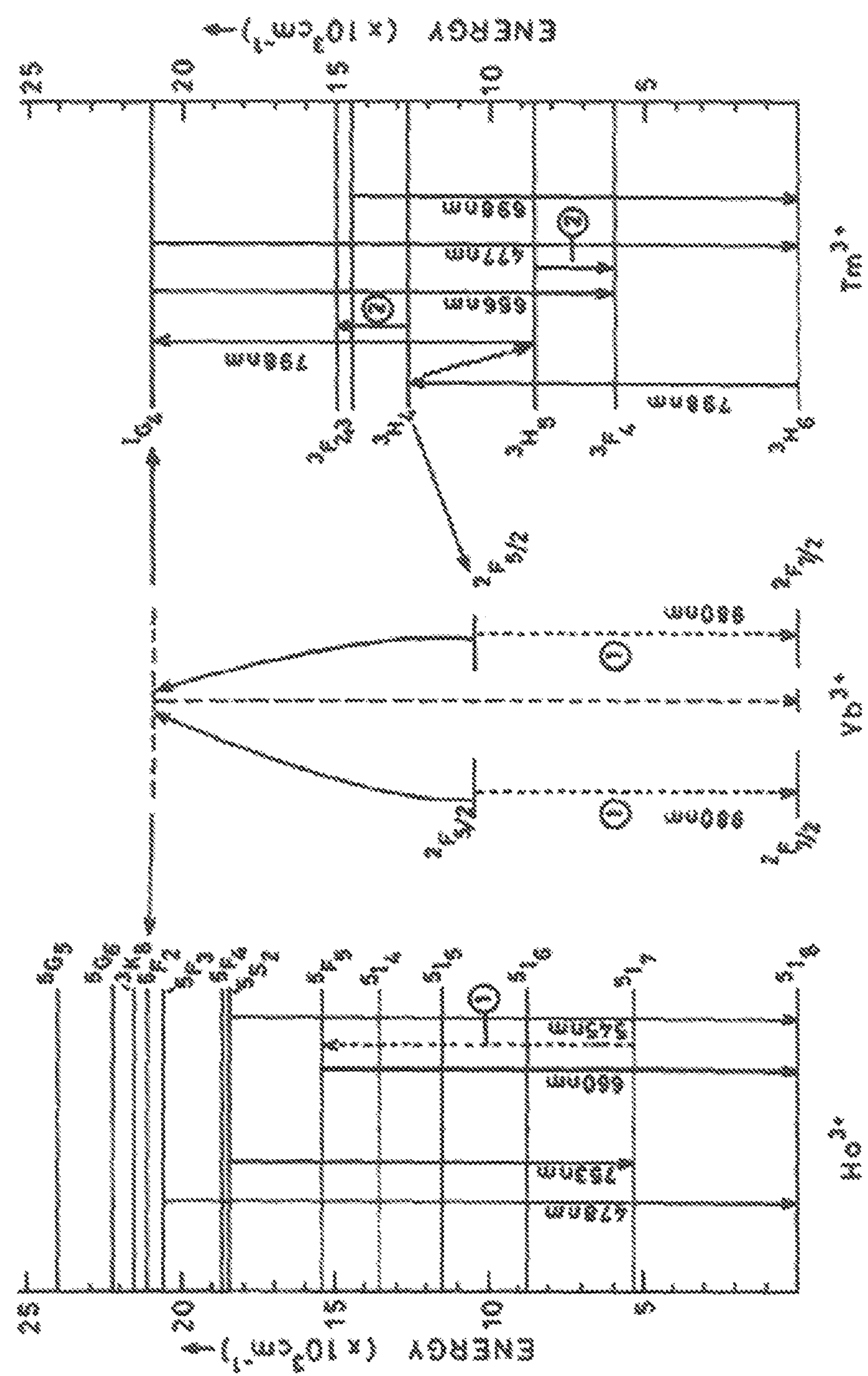
FIG. 2 shows the energy levels and mechanism involved in up-conversion processes of $Ho^{3+}$, $Yb^{3+}$, $Tm^{3+}$ activators.

Particular embodiments of compounds that reveal up-conversion under laser light (wavelength of 980 nm) include compounds according to Formula 1 or Formula 2 where R includes $Ho^{3+}$, $Pr^{3+}$, $Nd^{3+}$, $Er^{3+}$, $Tm^{3+}$, $Yb^{3+}$, and combinations thereof, and more particularly $Er^{3+}$, $Yb^{3+}$, $Tm^{3+}$, and combinations thereof. As shown in FIGS. 1 and 2, $Yb^{3+}$ has a very strong excitation cross section between the states $^2F_{7/2} \rightarrow {}^2F_{5/2}$ but no high excitation states sufficient for up-conversion. Therefore, energy transfer up-conversion with another species such as $Er^{3+}$, $Tm^{3+}$ or $Ho^{3+}$ is needed to create an emission in the visible part of the spectrum. Thus, up-conversion efficiencies can be sensitized by significant amounts of $Yb^{3+}$ substituted into the host lattice. Additionally, transition metal activated up-conversion phosphors, such as $Ni^{2+}$, $Mn^{2+}$, $Cr^{3+}$, $Ti^{2+}$, Re, $Os^{4+}$ and $Mo^{3+}$, can also allow for up-conversion In one particular embodiment represented by Formula 1, R can include $Yb^{3+}$, such as a combination of $Yb^{3+}$and $Tm^{3+}$or a combination of $Tm^{3+}$, $Yb^{3+}$, and $Er^{3+}$. For instance, a tri-doped combination of Formula 1, where R includes a combination of $Tm^{3+}$, $Yb^{3+}$, and $Er^{3+}$, can result in white light emission from up-conversion of a laser light (wavelength of 980 nm). In these embodiments of Formula 1 where R includes $Yb^{3+}$, a can be up to about 0.15(e.g., $0<a<0.15$, such as about 0.001 to about 0.1). Therefore, the sum of co-doping can be a =about 0.1. In some embodiments, more $Yb^{3+}$can be included than the other components of R (e.g., about 2 to about 5 times the amount of $Tm^{3+}$and/or $Er^{3+}$), though the sum (Le., "a") will stay up to about 0.15.

One particularly preferred embodiment corresponds to co-doped $Yb^{3+}$ and $Tm^{3+}$ in $Sr_3AlO_4F$-type host materials (e.g., Formula 1, where R is a combination of $Yb^{3+}$ and $Tm^{3+}$). Without wishing to be bound by any particular theory, it is believed that a multi-step energy transfer acts as the up-conversion mechanism, enhanced by the presence of $Yb^{3+}$ pairs at larger dopant concentrations (e.g., about 2 to about 5 times the dopant concentration of $Tm^{3+}$). (See, FIG. 1). Additionally, since the host lattice of Formula 1 can be doped with larger amounts of $Yb^{3+}$, the presence of $Yb^{3+}$ pairs can be increased.

In yet another embodiment, $Ho^{3+}$, $Tm^{3+}$ and $Yb^{3+}$ co-doping (e.g., Formula 1, where R is a combination of $Ho^{3+}$, $Tm^{3+}$ and $Yb^{3+}$) resulting in red ($Ho^{3+}$), green ($Ho^{3+}$), and blue ($Tm^{3+}$) emission can be used to multiplex as well as emit white light in an up-conversion processes given the appropriate excitation power. Again, $Yb^{3+}$ is believed to play the role of a sensitizer and facilitates energy transfer to $Tm^{3+}$ and $Ho^{3+}$. (See, FIG. 2).

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

What is claimed:

1. A light emitting device, comprising:

an energy source configured to generate light energy; and an up-conversion phosphor configured to emit light having a wavelength shorter than that of the light energy generated from the energy source, wherein the up-conversion phosphor comprises an ordered oxyfluoride compound having a formula:

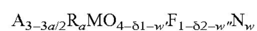

$$A_{3-3a/2}R_aMO_{4-\delta 1-w'}F_{1-\delta 2-w''}N_w$$

where A is Sr alone or Sr mixed with Ba and/or Ca such that A is made up of at least ⅔ mole % of Sr and ⅓mole % or less of Ba and/or Ca; R is Ho, Pr, Nd, Er, Tm, Yb, or combinations thereof; M is Al, Ga, In, B, W, Mo, or mixtures thereof; $0<a<0.3$; δ1 and δ2 are both about 0.01 to about 0.15; and $0 \leq w \leq 0.05$ such that $0 \leq w' \leq 0.1$ and $0 \leq w'' \leq 0.15$.

2. The light emitting device as in claim 1, wherein w is 0, w' is 0 and w" is 0.

3. The light emitting device as in claim 1, where R is $Er^{3+}$, $Yb^{3+}$, $Tm^{3+}$, or combinations thereof.

4. The light emitting device as in claim 1, where R includes $Yb^{3+}$.

5. The light emitting device as in claim 4, wherein R is a combination of $Yb^{3+}$and at least one of $Ho^{3+}$, $Pr^{3+}$$Nd^{3+}$, $Er^{3+}$, or $Tm^{3+}$.

6. The light emitting device as in claim 4, wherein more $Yb^{3+}$is included than any other components of R.

7. The light emitting device as in claim 4, wherein R is a combination of $Yb^{3+}$and at least one of $Tm^{3+}$or $Er^{3+}$.

8. The light emitting device as in claim 4, wherein R is a combination of $Yb^{3+}$and at least one of $Tm^{3+}$or $Ho^{3+}$.

9. The light emitting device as in claim 8, wherein R includes a combination of $Yb^{3+}$, $Tm^{3+}$, and $Ho^{3+}$.

10. The light emitting device as in claim 4, wherein R is a combination of $Yb^{3+}$and $Tm^{3+}$.

11. The light emitting device as in claim 4, wherein R includes $Yb^{3+}$in an amount that is about 2 to about 5 times greater than a combined amount of $Tm^{3+}$and/or $Er^{3+}$.

12. The light emitting device as in claim 4, wherein $0<a<0.15$.

13. The light emitting device as in claim 4, wherein a is about 0.001 to about 0.1.

14. The light emitting device as in claim 1, wherein δ1 and δ2 are both about 0.05 to about 0.1.

15. The light emitting device as in claim 1, wherein the light energy excites the up-conversion phosphor such that the up-conversion phosphor emits visible light having a wavelength of from about 380 to about 750 nm.

16. The light emitting device as in claim 1, wherein the light energy that excites the up-conversion phosphor has a wavelength of from about 800 nm to about 1000 nm.

17. The light emitting device as in claim 1, wherein the light energy that excites the up-conversion phosphor has a wavelength of about 980 nm.

18. A method of up-converting light energy, the method comprising:

exposing an up-conversion phosphor to light energy, wherein the up-conversion phosphor emits light having a wavelength shorter than that of the light energy, the up-conversion phosphor comprising an ordered oxy-fluoride compound having a formula:

$$A_{3-3a/2}R_aMO_{4-\delta 1-w'}F_{1-\delta 2-w''}N_w$$

where A is Sr alone or Sr mixed with Ba and/or Ca such that A is made up of at least ⅔ mole % of Sr and ⅓ mole % or less of Ba and/or Ca; R is Ho, Pr, Nd, Er, Tm, Yb, or combinations thereof; M is Al, Ga, In, B, W, Mo, or mixtures thereof; $0<a<0.3$; δ1 and δ2 are both about 0.01 to about 0.15; and $0 \le w \le 0.05$ such that $0 \le w' \le 0.1$ and $0 \le w'' \le 0.15$.

19. The method as in claim 18, wherein the light energy excites the up-conversion phosphor such that the up-conversion phosphor emits visible light having a wavelength of from about 380 to about 750 nm.

20. The method as in claim 19, wherein the light energy that excites the up-conversion phosphor has a wavelength of from about 800 nm to about 1000 nm.

21. The method as in claim 19, wherein the light energy that excites the up-conversion phosphor has a wavelength of about 980 nm.

22. A light emitting device, comprising:

an energy source configured to generate light energy; and an up-conversion phosphor configured to emit light having a wavelength shorter than that of the light energy generated from the energy source, wherein the up-conversion phosphor comprises an ordered oxyfluoride compound having a formula:

$$A_{3-3a/2}R_aMO_{4-\delta 1-w'}F_{1-\delta 2-w''}N_w$$

where A is Sr alone or Sr mixed with Ba and/or Ca such that A is made up of at least ⅔ mole % of Sr and ⅓ mole % or less of Ba and/or Ca; R is a combination of $Yb^{3+}$ and at least one of $Ho^{3+}$, $Pr^{3+}$, $Nd^{3+}$, $Er^{3+}$, or $Tm^{3+}$; M is Al, Ga, In, B, W, Mo, or mixtures thereof; $0<a<0.3$; δ1 and δ2 are both about 0.01 to about 0.15; and $0 \le w \le 0.05$ such that $0 \le w' \le 0.1$ and $0 \le w'' \le 0.15$ , wherein more $Yb^{3+}$ is included than an other components of R.

23. The light emitting device as in claim 22, wherein w is 0, w' is 0 and w'' is 0.

24. The light emitting device as in claim 22, wherein R is a combination of $Yb^{3+}$ and at least one of $Tm^{3+}$ or $Er^{3+}$.

25. The light emitting device as in claim 22, wherein R is a combination of $Yb^{3+}$ and at least one of $Tm^{3+}$ or $Ho^{3+}$.

26. The light emitting device as in claim 25, wherein R includes a combination of $Yb^{3+}$, $Tm^{3+}$, and $Ho^{3+}$.

27. The light emitting device as in claim 22, wherein R is a combination of $Yb^{3+}$ and $Tm^{3+}$.

28. The light emitting device as in claim 22, wherein R includes $Yb^{3+}$ in an amount that is about 2 to about 5 times greater than a combined amount of $Tm^{3+}$ and/or $Er^{3+}$.

29. The light emitting device as in claim 22, wherein $0<a<0.15$.

30. The light emitting device as in claim 22, wherein a is about 0.001 to about 0.1.

* * * * *